United States Patent [19]

Kumesawa et al.

[11] Patent Number: 5,014,132
[45] Date of Patent: May 7, 1991

[54] CCD IMAGER

[75] Inventors: Tetsuro Kumesawa, Kanagawa; Yasuo Kanou; Osamu Nishima, both of Tokyo; Masaaki Isobe; Hiromichi Matsui, both of Kanagawa, all of Japan

[73] Assignee: Sony Corporation, Tokyo, Japan

[21] Appl. No.: 383,179

[22] Filed: Jul. 21, 1989

[30] Foreign Application Priority Data

Jul. 30, 1988 [JP] Japan .................. 63-191470

[51] Int. Cl.$^5$ .............................. H04N 3/14
[52] U.S. Cl. .................. 358/213.19; 358/213.31
[58] Field of Search ............ 357/24 LR; 358/213.19, 358/213.11, 228, 213.26, 213.23, 213.31

[56] References Cited

U.S. PATENT DOCUMENTS

| | | | |
|---|---|---|---|
| 4,229,754 | 10/1980 | French | 357/24 LR |
| 4,245,164 | 1/1981 | Funahashi | 357/24 LR |
| 4,247,862 | 1/1981 | Klein | 357/24 LR |
| 4,348,690 | 9/1982 | Jastrzebski et al. | 357/24 LR |
| 4,912,560 | 3/1990 | Osawa et al. | 358/213.19 |

Primary Examiner—Stephen Brinich
Attorney, Agent, or Firm—Ronald P. Kananen

[57] ABSTRACT

A CCD imager includes a large number of light receiving sections each having in turn a semiconductor surface region of a second conductivity type, a first semiconductor region of a first conductivity type, a semiconductor region of the second conductivity type and a second semiconductor region of the first conductivity type, vertically. The second semiconductor region is formed by a dual structure of the low concentration semiconductor region and the high concentration semiconductor region. The dual structure provides for shuttering at a lower voltage since the potential barrier along the depth of the light receiving section is no longer affected by the amount of the stored charges, while spreading of the depletion layer at the junction is suppressed by the high concentration semiconductor region.

6 Claims, 2 Drawing Sheets

CCD IMAGER

BACKGROUND OF THE INVENTION

1. Field of the Invention

This invention relates to a CCD imager in which a plurality of light receiving sections are formed for photoelectrical conversion on a semiconductor substrate and image signals are outputted from signals transferred from these light receiving sections. More particularly, it relates to a vertical overflow drain structure CCD imager in which electrical charges are swept off into the semiconductor substrate.

2. Description of the Prior Art

The CCD imager in general includes a number of light receiving sections arrayed in a two-dimensional matrix and signal charges for producing the image information are produced in these light receiving sections. As the structure of the light receiving section of this CCD imager, there is known a structure in which a P type well region is formed in an n type semiconductor substrate and in which are provided a P type semiconductor surface region for suppressing the current section and an n+ type semiconductor region forming a photodiode on the bottom side of the P type semiconductor surface region. The CCD imager of this structure is shown for example in the "Nikkei Micro-Devices", issue of October, 1987, p. 60–67, published by Nikkei McGraw Hill.

As the technique of sweeping off excess charges from the light receiving section, there is known a technique of providing a lateral overflow drain. The technique of sweeping off excess electron charges by specially designing the potential along the depth of the light receiving section, as disclosed in the Laid Open Japanese Patent Publication No. 18172/1986, is also known as the pertinent technique.

If the light receiving section has a pnpn structure, looking from its surface, it is necessary for the impurity concentration of the n type semiconductor substrate to be of the order of $1 \times 10^{14}$ cm$^{-3}$, in order to provide for blooming margin and control at the three voltage level.

However, because of the reverse-biased junction between the n type semiconductor substrate and the p type well region, the extent of the depletion layer is spread to about 30 μm for the aforementioned impurity concentration of the semiconductor substrate, such that the shuttering voltage is increased to as high as 50 V in terms of the DC value. The result is a deteriorated reliability of the shuttering operation and the step-like regions produced on the monitor display surface on account of the infeasibility of the shuttering operation.

On the other hand, it is desirable that the amount of the stored charges be not increased at an illuminance corresponding to saturation. However, this has not been achieved satisfactorily in the above described light receiving section. Hence, a demand has been raised for improving knee characteristics.

SUMMARY OF THE INVENTION

It is a principal object of the present invention to provide a CCD imager in which spreading of the depletion layer during shuttering may be suppressed to realize a low shuttering voltage.

It is another object of the present invention to provide a CCD imager in which an increase in the amount of the stored charges may be suppressed to improve the knee characteristics.

In the CCD imager of the present invention, the light receiving section is of a structure in which the semiconductor regions of different conductivity types are formed alternately along the depth from the surface side of the section. For example, when the lowermost semiconductor region, such as, for example, the semiconductor substrate, is of the n type, the light receiving section has the pnpn structure when viewed from the surface side. This lowermost semiconductor region is formed by a semiconductor region of a low impurity concentration and a semiconductor region of a high impurity concentration which is provided on the bottom side of the low impurity concentration semiconductor region. A voltage is applied to the high impurity concentration semiconductor region for electronic shuttering. The depth of the high impurity concentration semiconductor region may be set so as to be within the domain of the depletion layer that is produced at the time of application of the shuttering voltage. By the lowermost high concentration semiconductor region of the dual structure substrate consisting of the low concentration semiconductor region and the high concentration semiconductor region, it becomes possible to lower the shuttering voltage and to improve knee characteristics of the CCD imager.

DETAILED DESCRIPTION OF THE INVENTION

Figure 1:
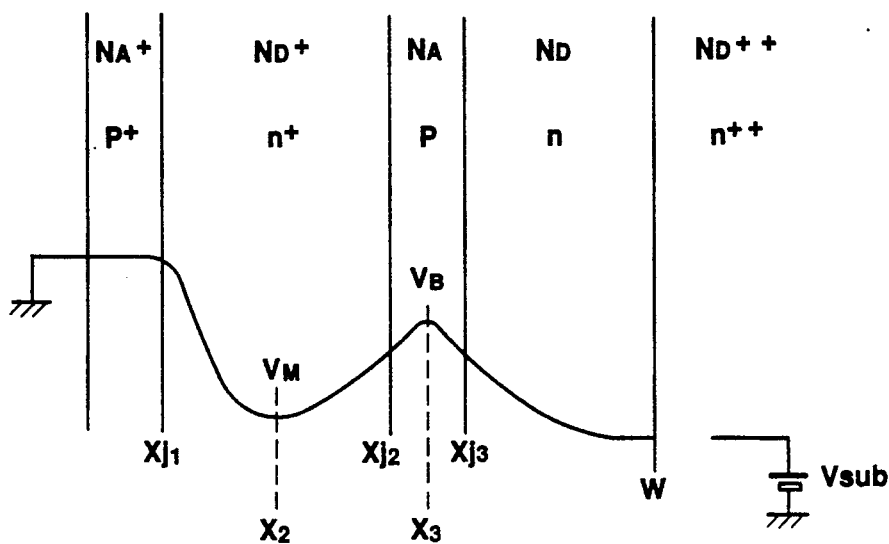
FIG. 1 is a diagram showing the potential distribution along the depth of the light receiving section of the CCD image according to the present invention.

Referring first to FIG. 1, the operating principle of the CCD imager of the present invention will be explained.

In the CCD imager of the present invention, spreading of the depletion layer at the reversely-biased junction between a semiconductor region of a second conductivity type and a low concentration semiconductor region of a first conductivity type is suppressed by a high concentration semiconductor region of the first conductivity type to enable the charges to be discarded in the vertical direction at a lesser potential difference. A one-dimensional model of the potential is shown in FIG. 1.

In the one-dimensional model, shown in FIG. 1, the region from the surface to a depth $x_{j1}$ is the p+ type semiconductor surface region ($N_A^+$), while the region from the depth $x_{j1}$ to a depth $x_{j2}$ is the n+ type first semiconductor region ($N_D^{++}$) and the region from the depth $x_{j2}$ to a depth $x_{j3}$ is the p type semiconductor region ($N_A$). The region from the depth $x_{j3}$ to a depth W is the n type low concentration semiconductor region ($N_D$), while the region deeper than the depth W is the $n^{++}$ type high concentration semiconductor region ($N_D^{++}$). The relation of the concentrations is given as $N_A^+>>N_D^{++}$ and $N_D$. It is assumed that the potential value at the bottom of the potential curve in the $n^+$ type first semiconductor region and the depth thereat are given by $V_m$ and $x_2$, respectively, whilst the peak potential value in the p type semiconductor region and the depth thereat are given by $V_B$ and $x_3$, respectively. It is also assumed that the substrate voltage $V_{sub}$ is applied to the $N^{++}$ type high concentration semiconductor region, whilst the $p^+$ type semiconductor surface region is fixed at the ground level.

From each boundary condition, the following equations, $$x_{j2} - x_2 = \left[ \frac{2\epsilon_s N_A(V_M - V_B)}{qN_D^+(N_A + N_D^+)} \right]^{\frac{1}{2}} \quad (1)$$

$$x_3 - x_{j2} = \left[ \frac{2\epsilon_s N_D^+(V_M - V_B)}{qN_A(N_A + N_D^+)} \right]^{\frac{1}{2}} \quad (2)$$

$$x_{j3} - x_3 = \left[ \frac{2\epsilon_s N_D(V_{sub} - V_B)}{qN_A(N_A + N_D)} \right]^{\frac{1}{2}} \quad (3)$$

$$W - x_{j3} = \left[ \frac{2\epsilon_s N_A(V_{sub} - V_B)}{qN_D(N_A + N_D)} \right]^{\frac{1}{2}} \quad (4)$$

$$V_M = \frac{qN_D^+}{2\epsilon_s}(x_2 - x_{j1})^2 \quad (5)$$

are derived.

Also, from equation (5), the following equation (6)

$$x_2 = \left[ \frac{2\epsilon_s V_M}{qN_D^+} \right]^{\frac{1}{2}} + x_{j1} \quad (6)$$

is derived.

Modifying the equation (4), the following equation (7)

$$V_B = V_{sub} - \frac{qN_D(N_A + N_D)}{2\epsilon_s N_A} \cdot (W - x_{j3})^2 \quad (7)$$

is obtained.

Then, $V_M$ is calculated. For simplicity, and $\lambda$, $\alpha$ are set to $$\lambda = \left[ \frac{qN_D^+}{2\epsilon_s} \right]^{\frac{1}{2}}, \alpha = \frac{N_A}{N_A + N_D^+}$$

Substituting the equation (6) into the equation (1), the following equation (8)

$$\lambda(x_{j2} - x_{j1}) - \sqrt{V_M} = \sqrt{\alpha(V_M - V_B)} \quad (8)$$

is obtained. Solving this equation (8) as the quadratic equation for $\sqrt{V_M}$, the following equation (9)

$$\sqrt{V_M} = \frac{\lambda(x_{j2} - x_{ji})}{1 - \alpha} \cdot (1 + \sqrt{\beta}) \quad (9)$$

$$\left( \because \beta = \alpha \left[ 1 - \frac{(1 - \alpha)V_B}{\lambda^2(x_{j2} - x_{j1})^2} \right] \right)$$

is obtained.

In this equation (9), in order for $V_M$ to exist, the minus ($-$) sign of the double sign is to be adopted. Multiplying each side of the equation (9) by itself, the following equation (10)

$$V_M = \frac{\lambda^2(x_{j2} - x_{j1})^2}{(1 - \alpha)^2} \cdot (1 - \sqrt{\beta})^2 \quad (10)$$

is derived.

Assuming that $V_M = V_B$ during application of the shuttering voltage, and modifying the equation (8), $$V_B = \lambda^2(x_{j2} - x_{j1})^2 \quad (11)$$

Substituting this equation (11) into the equation (7), $$V_{sub(shutter)} = \lambda^2(x_{j2} - x_{j1})^2 + \frac{qN_D(N_A + N_D)}{2\epsilon_s N_A}(W - x_{j3})^2 \quad (12)$$

It is seen from this equation (12) that the shuttering voltage $V_{sub}$(shutter) may be reduced by reducing the depth W of the high concentration semiconductor region.

As may be seen from equation (7), the value of the peak potential $V_B$ in the p type semiconductor region becomes constant without dependency upon the amount of the stored charges. Hence, the knee characteristics may be improved, as in the case of the lateral overflow drain structure CCD imager.

For computing an exemplary shutter voltage $V_{sub}$ (shutter), substituting $N_D^+ = 5 \times 10^{15}(cm^{-3})$, $N_A = 1 \times 10^{17}(cm^{-3})$, $x_{j3} = 3.5$ μm, $x_{j2} = 2.5$ μm, $W = 6$ μm and $x_{j1} = 0.3$ μm, into the equation (12), we obtain $V_{sub}$(shutter) = 18(V).

In the above explanation, it is assumed that the depletion layer is compulsorily terminated at a depth W. At least, however, the tendency for the shutter voltage $V_{sub}$(shutter) to be reduced may be substantially realized by providing the high concentration semiconductor region of a first conductivity type within the domain of the depletion layer that is spread at the time of application of the shuttering voltage, thereby enabling electrical shuttering to be performed at a lower shutter voltage.

EMBODIMENT

The CCD imager of the illustrative embodiment is an example of an interline transfer type CCD imager wherein the substrate is formed by an n type semiconductor region of a low impurity concentration and an $n^{++}$ type region of a high impurity concentration to realize the lowering of the electrical shuttering voltage.

Figure 2:
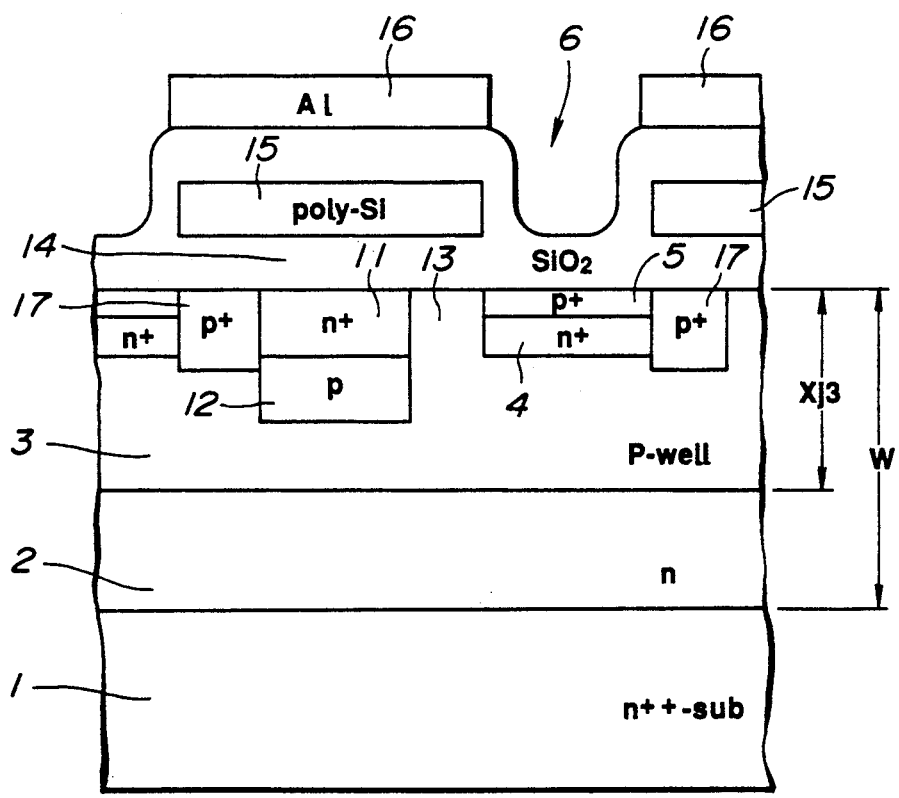
FIG. 2 is a diagrammatic cross-sectional view showing essential portions of an embodiment of a CCD imager according to the present invention.

The structure of the CCD imager is shown in FIG. 2, wherein the n-type semiconductor substrate, which is the second semiconductor region of a first conductivity type, is comprised of an n type semiconductor region of a low impurity concentration 2 and an $n^{++}$ type semiconductor substrate proper of a high impurity concentration 1. On the top of this n type semiconductor region of the lower impurity concentration 2 is formed a p type well region 3 which is a semiconductor region of the second conductivity type.

A light receiving section 6 is surrounded by this p type well region 3 and includes a p+ type positive hole storage layer 5, which is a semiconductor surface region of the second conductivity type, and an n+ type semiconductor region 4 on the bottom side of the positive hole storage layer 5. Thus the light receiving section 6 includes, looking from its surface, the p+ type positive hole storage layer 5, n+ type semiconductor region 4, p type well region 3, n type low concentration semiconductor region 2 and the n++ type high concentration semiconductor substrate proper 1. By way of an example, the n type low concentration semiconductor region 2 has an impurity concentration of the order of $10^{14}$ cm$^{-3}$, whereas the n++ type high concentration semiconductor substrate proper 1 has the impurity concentration of the order of $10^{16}$ cm$^{-3}$, which is about 100 times that of the semiconductor region 2. The depth W of the interface between the n++ type high concentration semiconductor substrate 1 and the n+ type low concentration semiconductor region 2 is of the order of about 7 $\mu$m, whereas the depth $x_{j3}$ of the junction between the p type well region 3 and the n type low concentration semiconductor region 2 is of the order of 3 $\mu$m. The substrate structure consisting of the low concentration semiconductor region and the high concentration semiconductor region is formed by ion implantation of n type high concentration impurities or p type compensatory impurities, or by stacking an n+ type epitaxial layer on the n++ type high concentration semiconductor substrate proper 1.

In the p type well region 3, there are formed an n+ type charge transfer section 11 at a distance from the n+ type semiconductor region 4 along the surface of the region 3, and a second p type well 12 on the bottom side of the section 11. A read-out section 13 is defined in the domain between the n+ type charge transfer section 11 and the n+ type semiconductor region 4, and a channel is formed in this read-out section 13 by the electrical voltage in a polysilicon layer 15 which is stacked on the top of the well region 3 by the intermediary of an insulating layer 14. The light from an object to be imaged may fall on the light receiving section 6 which is devoid of the polysilicon layer 15 acting as the transfer electrode or an aluminum layer 16 acting as a light shield. Channel stop regions 17, 17 are formed on the lateral superficial sides of the n+ type charge transfer section 11 and the light receiving section 6. In the interline CCD imager, the n+ type charge transfer section 11 functions as a vertical register contiguous to a horizontal register provided orthogonally to the vertical register. The image signals transferred in the form of signal charges are taken out line by line from the horizontal register via an output buffer.

The structure of the light receiving section is further explained in detail. A ground voltage VSS is supplied to the p+ type positive hole storage layer 5 on the surface of the p type well region 3, whilst a variable substrate voltage $V_{sub}$ is supplied to the lowermost n++ type high concentration semiconductor substrate 1. The potential between the p+ type positive hole storage region 5 and the n++ type high concentration semiconductor substrate proper 1 exhibits a curve such as is shown in FIG. 1, and a potential barrier VB is formed in the p type well region 3, so that the signal charges continue to be stored at the bottom of the potential $V_M$ of a region having a shallower depth than the potential barrier $V_B$.

During electronic shuttering, a higher voltage is applied to the n++ type high concentration semiconductor substrate 1 to sweep off the signal charges into the substrate. In the CCD imager of the illustrative embodiment, spreading of the depletion layer at the junction between the p type well region 3 and the n type low concentration semiconductor region 2 is suppressed by the n++ type high concentration semiconductor substrate 1 to enable the shuttering to be performed at a lower electrical voltage.

Figure 3:
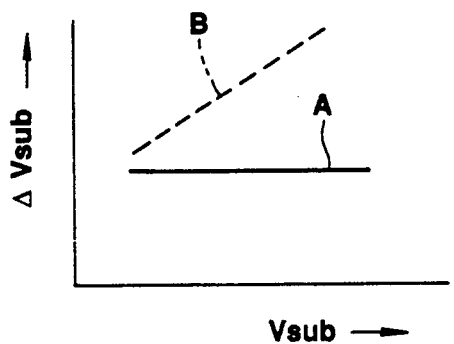
FIG. 3 is a diagram showing changes in the shuttering voltage for an embodiment of the CCD imager according to the present invention as compared with those of a conventional CCD imager.

The shuttering voltage characteristics are shown in FIG. 3, wherein the abscissa designates the substrate voltage $V_{sub}$ and the ordinate designates the voltage $\alpha V_{sub}$ necessary to perform the shuttering. In the conventional pnpn type CCD imager, the voltage $\alpha V_{sub}$ is increased with an increase in the substrate voltage $V_{sub}$, as indicated by a broken line D, so that sufficient shuttering cannot be achieved unless a high voltage is employed. In the pnpn n++ type CCD imager of the illustrative embodiment, a high voltage $\alpha V_{sub}$ is not required, even if the substrate voltage $V_{sub}$ is increased, as indicated by a solid line A, so that the shuttering may be performed at a lower voltage.

Figure 4:
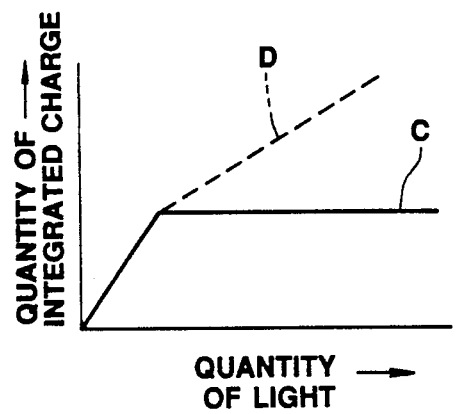
FIG. 4 is a diagram showing knee characteristics of an embodiment of the CCD imager according to the present invention as compared with those of a conventional CCD imager.

As regards knee characteristics, in the conventional CCD imager, the amount of the stored charges is increased after the light volume exceeds the saturation value, as indicated by a broken line D in FIG. 4. In the CCD imager of the illustrative CCD imager, the increase in the stored charges may be suppressed, as indicated by a solid line C in FIG. 4, so that the blooming may be controlled effectively.

What is claimed is:

1. A CCD imager for outputting an image information comprising:

a plurality of light receiving sections each including a semiconductor surface region of a second conductivity type, a first semiconductor region of a first conductivity type, a semiconductor region of said second conductivity type and a second semiconductor region of said first conductivity type, in this sequence, when seen from the surface along the depth thereof, said second semiconductor region consisting of a low concentration semiconductor region of said first conductivity type on the bottom side of said semiconductor region of said second conductivity type and a high concentration semiconductor region of said first conductivity type on the bottom side of said low concentration semiconductor region.

2. The CCD imager according to claim 1, wherein said semiconductor surface region of said second conductivity type is fixed at a ground potential, a variable voltage is applied to said second semiconductor region of said first conductivity type, and electrical charges are swept off into said second semiconductor region.

3. The CCD imager according to claim 2, wherein said high concentration semiconductor region of first conductivity type is provided within the domain of a depletion layer of the junction between said semiconductor region of said second conductivity type and the low concentration semiconductor region of said first conductivity type at the time of application of a shuttering voltage.

4. The CCD imager according to claim 1, wherein the impurity concentration of said high concentration semiconductor region is not less than 100 times the impurity concentration of said low concentration semiconductor region.

5. The CCD imager according to claim 1, wherein said light receiving sections are arrayed in a dimensional matrix and charge transfer sections are formed along vertical rows of said light receiving sections.

6. A CCD imager for outputting an image information comprising:
a plurality of light receiving sections each including a p type semiconductor surface region, an n type first semiconductor region, a p type semiconductor and an n type second semiconductor region,
said second semiconductor region consisting of an n type low concentration semiconductor region on the bottom side of said p type semiconductor region and an n type high concentration semiconductor region on the bottom side of said low concentration semiconductor region.

* * * * *